United States Patent
Oppelt et al.

(10) Patent No.: US 7,239,144 B2
(45) Date of Patent: Jul. 3, 2007

(54) ANTENNA AMPLIFIER, IN PARTICULAR FOR A MAGNETIC RESONANCE ANTENNA

(75) Inventors: Ralph Oppelt, Uttenreuth (DE); Markus Vester, Nürnberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/139,069

(22) Filed: May 27, 2005

(65) Prior Publication Data

US 2005/0270031 A1 Dec. 8, 2005

(30) Foreign Application Priority Data

May 28, 2004 (DE) .................. 10 2004 026 713

(51) Int. Cl.
*G01V 3/00* (2006.01)

(52) U.S. Cl. ...................................................... 324/322
(58) Field of Classification Search ................. 324/322
See application file for complete search history.

(56) References Cited

U.S. PATENT DOCUMENTS

| 4,922,204 | A | * | 5/1990 | Duerr et al. ................ 324/322 |
| 5,065,760 | A | | 11/1991 | Krause et al. |
| 6,844,730 | B2 | * | 1/2005 | Feld et al. .................... 324/318 |
| 2006/0038568 | A1 | * | 2/2006 | Oppelt ........................ 324/322 |

* cited by examiner

*Primary Examiner*—Brij Shrivastav
*Assistant Examiner*—Dixomara Vargas
(74) *Attorney, Agent, or Firm*—Schiff Hardin LLP

(57) ABSTRACT

An antenna amplifier, in particular for a magnetic resonance antenna, has a sheath wave barrier integrated into the signal path of the antenna amplifier in the form of a component designed exclusively for transfer of a differential signal.

17 Claims, 3 Drawing Sheets

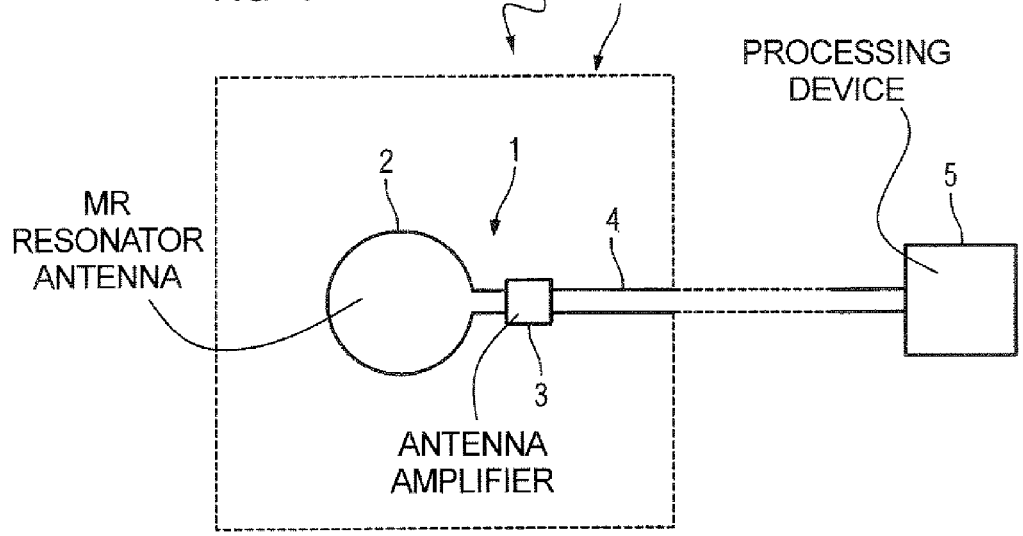
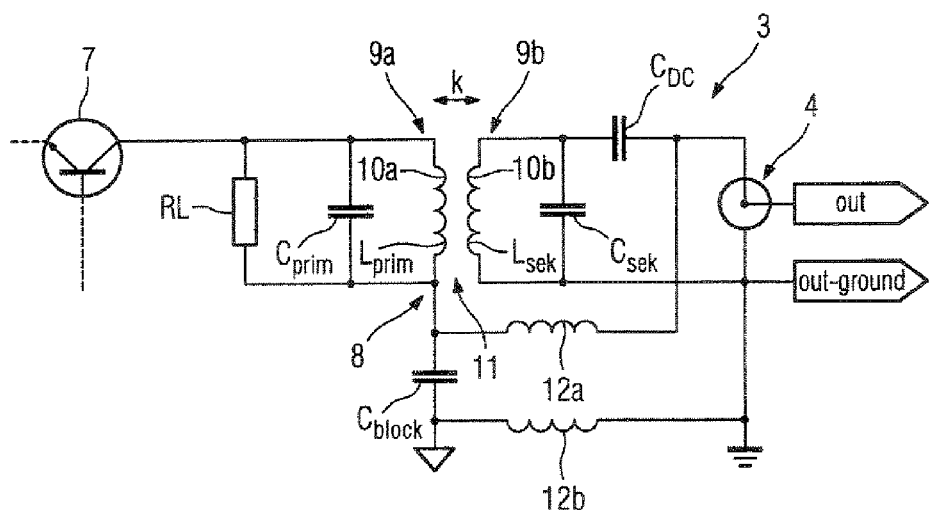

ANTENNA AMPLIFIER, IN PARTICULAR FOR A MAGNETIC RESONANCE ANTENNA

BACKGROUND OF THE INVENTION

1. Field of the Invention

The invention concerns an antenna amplifier, in particular for a magnetic resonance antenna.

2. Description of the Prior Art

In magnetic resonance technology, local surface coils (known as "loop antennas") or array arrangements assembled from local coils are used for acquisition of image information of the examination subject. Such surface coils or antennas include the actual antenna or receiver component (resonator), the signals from which are supplied to an antenna amplifier that is disposed relatively close to the reception component. There the (possibly noise-afflicted) signal is amplified and conducted from the MR apparatus via a coaxial line for further processing. Sheath currents or the sheath waves as a consequence thereof that are created in the region of the coaxial line cause problems. These generate E-fields and B-fields that form between the "transparent" coaxial line and the surroundings. These sheath wave currents, although very weak in terms of their magnitude, influence the actual usable signal and can alter this to the point of unusability. More or less strongly pronounced positive and negative feedbacks that alter the originally completely smooth broadband frequency response in an unforeseeable manner are created in regions due to the phase changing with respect to the frequency. Given a matching phase, the arrangement (formed of the antenna and preamplifier) can even oscillate.

To suppress the influence of sheath wave currents, it is known to integrate a sheath wave barrier before the antenna amplifier, thus in the feed line from the antenna part to the amplifier. However, this worsens the noise ratio due to the damping effect of the inserted element, meaning that the noise component is increased, which is disadvantageous for the resolution of the useful signal. Another known solution is the insertion of one or more sheath wave barriers in the coaxial cable exiting from the antenna amplifier and traveling out of the apparatus. This approach, however, leads to sheath wave problems when it is desired to directly connect the ground electrodes of two amplifier outputs, as is desirable, for example, in circular polarized systems. At high frequencies in which a magnetic resonance apparatus is operated with a high basic field strength of 1.5 T and more, sheath wave problems also already occur due to the cable section exiting from the antenna amplifier up to the first sheath wave barrier.

SUMMARY OF THE INVENTION

An object of the present invention is to suppress sheath waves from acting disadvantageously on the usable signal.

This object is achieved in accordance with the invention by an antenna amplifier (in particular for a magnetic resonance antenna) that has a sheath wave barrier integrated into the signal path thereof in the form of a component designed exclusively for transfer of a differential mode.

The integration of the sheath wave barrier directly into the antenna amplifier in accordance with the invention, is thus directly at the site of the signal amplification, and in fact preferably at a location at which a signal amplification has already at least partially occurred. The disadvantageous influence of an upstream sheath wave barrier with regard to the noise portion is thereby prevented, as are the problems resulting from an arrangement of the sheath wave barrier downstream from the antenna amplifier, in particular at high operating frequencies.

Moreover, the inventive sheath wave suppression is applied to the nature of the sheath wave itself. Sheath wave currents are naturally common mode [in-phase] signals, meaning that they propagate along a line, whereby the environment acts as ground potential. They are created in the case of a coaxial signal cable when, for example, the arriving current in the inner conductor and the return current in the shielding of the coaxial cable are unequal at a module (circuit combination) that is not grounded internally, for example a preamplifier with a loop antenna. The difference current then appears on the shielding the same as it would flow in an open, unshielded line. This current inequality can arise, for example, by a part of the return current that should flow completely via the shielding instead flowing as a displacement current through the capacitor between the environment and the ground plane of the module. Since the problem is thus for the most part of a capacitive nature, it is more serious at higher frequencies.

In contrast to the sheath wave signal that is, as described, a common mode signal, the actual useful signal is a differential signal, meaning that the currents of the two lines are counter-phase. The invention is based on the recognition that the influence of a sheath current can be corrected by inserting a component into the signal path of the antenna amplifier that exclusively transfers differential signals (thus transfers the just the useable signal), but blocks the common mode signal resulting from the sheath currents.

Such a component acting signal-selectively can be composed, according to a first embodiment of two separated and opposite, magnetically-coupled coils windings. The component represents an electrically-decoupled transformer. Important in this embodiment is that possible parasitic effects that would allow a common mode signal to pass are kept optimally small. For this reason it is appropriate for the capacitance of the two coils relative to one another be optimally small, preferably <1 pF. The coils themselves can exhibit different numbers of turns, with the secondary coil preferably having the fewer turns. Alternatively, it is possible for the coils to have the same number of turns, preferably only one turn.

It is appropriate to execute the sheath wave barrier formed by the component as a type of two-stage bandpass filter, with a capacitor for the formation of an oscillating circuit being associated with each coil, and with two radio-frequency chokes (inductances) being provided that serve for the current supply of the amplifier elements effecting the signal amplification. The inductance of the chokes is selected such that the resonance circuits form a resonant band filter at the operating frequency to be received.

As an alternative to the use of two opposing, separate coils, the component can be formed of a two-wire line rolled into a coil. For an optimal signal transfer, the electrical length of the wound choke should significantly correspond to $\lambda/2$ or a integer multiple thereof. It is also appropriate for the choke to operate at resonance at the operating frequency, i.e. a common mode resonance appears at the operating frequency, the operating frequency being the set radio-frequency of the magnetic resonance system. In order to be able to effect a compensation in the case of a non-matching (in particular, too low) resonance, it appropriate for the coil to have a core that can be screwed into the coil interior, in particular a copper core, for adjustment of the coil inductance and therewith the resonance. The inductance value of the common mode coil thus can be reduced without notably changing the electrical length of the line with regard to the λ/2 condition. At a resonance that is too high, it is also possible to use a ferrite core, but only for amplifier applications outside of a magnetic field.

As an alternative to adjustment of the resonance by a movable core, it is possible to modify the resonance with regard to the operating frequency using capacitors that are respectively provided between the connections of each line of the choke, whereby both capacitors are the same.

In the case of a common mode resonance that is too low, this can be compensated by a correspondingly low number of turns as an alternative to the use of a core, and the common mode inductance can be increased to match. A shortening of the electrical length accompanies this, however, which electrical length should (as described) preferably correspond to the λ/2 condition. In order to compensate this, in an embodiment of the invention two equally large capacitors can be provided between both identical connections of one line in order to compensate for the shorter electrical line length that arises due to the low number of turns.

The inventive antenna amplifier furthermore was two amplifier elements, in particular transistors, effecting the signal amplification. This preferably forms a cascade amplifier, but regardless of the design, the component can be connected between the two amplifier elements. It is also possible to connect it downstream from the second amplifier element on the output side.

In addition to the antenna amplifier itself, the invention also concerns a magnetic resonance (MR) antenna incorporating an antenna amplifier of the described type.

DESCRIPTION OF THE DRAWINGS

FIG. 1 is a schematic illustration of an inventive MR antenna using an inventive antenna amplifier.

FIG. 2 is a circuit diagram portion of an inventive antenna amplifier, including the output circuit, having a sheath wave barrier according to the two-storage bandpass filter principle.

DESCRIPTION OF THE PREFERRED EMBODIMENTS

Figure 3:
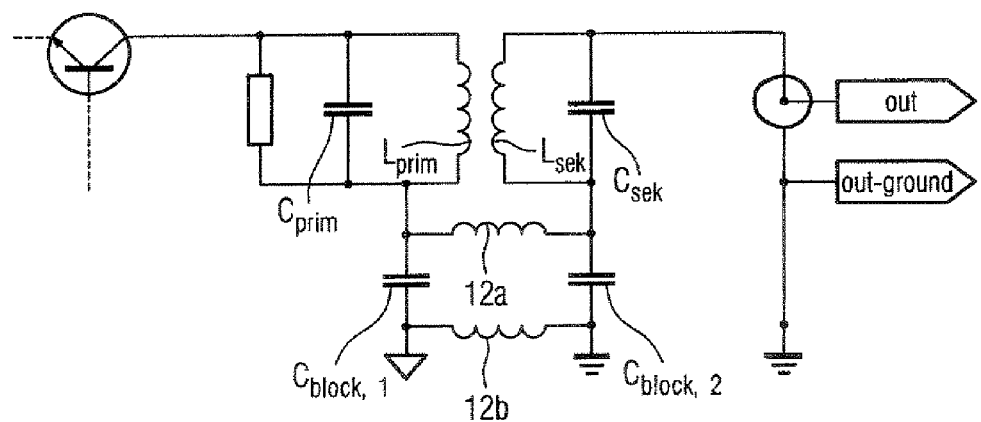
FIG. 3 is a circuit diagram of a further inventive embodiment of an antenna amplifier similar to that of FIG. 2.

FIG. 1 shows an inventive magnetic resonance antenna 1 (also called a "loop antenna") composed of a resonator 2 forming a surface coil as well as a downstream antenna amplifier 3 that serves for amplification of the acquired signal, that is output to a control and processing device 5 via a coaxial signal line 4. In the typical operating case, the MR antenna 1 is located within a magnetic resonance apparatus 6 that here is indicated only schematically.

A sheath wave barrier is inventively integrated into the antenna amplifier 3 for suppression of sheath wave currents that form at the coaxial signal cable 4. FIG. 2 shows a first exemplary embodiment.

The antenna amplifier 3 is shown in sections with its collector output circuit that has been formed into a sheath wave barrier. An amplifier element 7 is shown in form of a bipolar transistor together with a load resistor RL (for example in the range of 1 kΩ) that is transformed via a two-storage band filter 8 (formed of two resonance circuits 9a, 9b at 50 Ω such that the amplifier output is matched to a 50 Ω system. Each resonance circuit has a winding (coil) 10a or 10b that are, for example, mounted opposite one another on both sides of a substrate and thus are separated from one another. The winding 10a forms the primary winding, the winding 10b forms the secondary winding. Each winding exhibits its own impedance $L_{prim}$ or $L_{sec}$. Respective primary and secondary capacitors $C_{prim}$ and $C_{sec}$ are associated with each winding such that the two described resonance circuits are formed. The two windings 10a and 10b are magnetically coupled, thus a signal transfer is enabled in the form of a push-pull signal which is formed by an actual useable signal acquired via the antenna. In contrast, a common mode signal, as is generated by sheath wave currents occurring on the coaxial signal cable 4, is not transferred via the two windings 10a, 10b. Together they thus form a component 11 that is exclusively fashioned for transfer of a differential signal.

It is important to keep possible parasitic effects that would allow passage of a common mode signal optimally small. As a consequence, the coupling capacity of the two windings should be optimally low, preferably <1 pF, preferably in the range of <500 fF. The current supply of the amplifier element 7 as well as of a further upstream amplifier element (not shown in detail) (in the case of a cascade amplifier) is ensured via two RF chokes 12a, 12b, with the supply ensuing via the coaxial signal cable 4. The residual admittance of these two RF chokes (which can likewise act in a parasitic manner) should likewise be kept optimally small. Windings that are widely separated from one another are useful for a small winding capacity. Each winding 10a, 10b should be formed of at least one turn; a number of turns can also be provided; the number can be the same or different for the two coils 10a, 10b.

An amplified signal is supplied by the amplifier element 7 to the first resonance circuit 9a and via the primary winding 10a to the secondary winding 10b corresponding to the realized coupling factor k. A first blocking capacitor $C_{block}$ connects the radio-frequency signal to ground in the ground branch of the primary winding; a direct voltage blocking capacitor $C_{DC}$ prevents the supply voltage from arriving at the winding that would hinder the radio-frequency useful signal. This is present on the inner line of the coaxial cable while the shield of the coaxial cable 4 is connected to ground. Because RL>>50 Ω, it is also true that the primary inductivity $L_{prim}$ >> secondary inductance $L_{sec}$. The secondary inductance $L_{sec}$ is selected very small for an optimally slight capacitive coupling. For the desired filter curve, the coupling factor k as well as the values $C_{prim}$, $L_{prim}$, $C_{sec}$, $L_{sec}$ must agree very exactly, meaning that the band filter must be compensated.

FIG. 3 shows a somewhat modified embodiment of the antenna amplifier known from FIG. 2. Here the supply current initially flows via the secondary inductance $L_{sec}$ and then through the choke 12a while the RF secondary path is connected to ground via the blocking capacitor $C_{block, 2}$. This has the advantage that the choke 12a with both connections is connected to ground in terms of radio-frequency, precisely like the choke 12b, and not to the RF signal, as in the right connection of the choke 12a in FIG. 2. In the embodiment according to FIG. 3 (the same is true for the embodiment according to FIG. 4, which is described subsequently), both chokes 12a and 12b can be wound on a common winding body for space reduction. Here the impedance and the electrical length are irrelevant. Due to the addition of the magnetic currents, fewer turns given can be used in mutual winding bodies.

Figure 4:
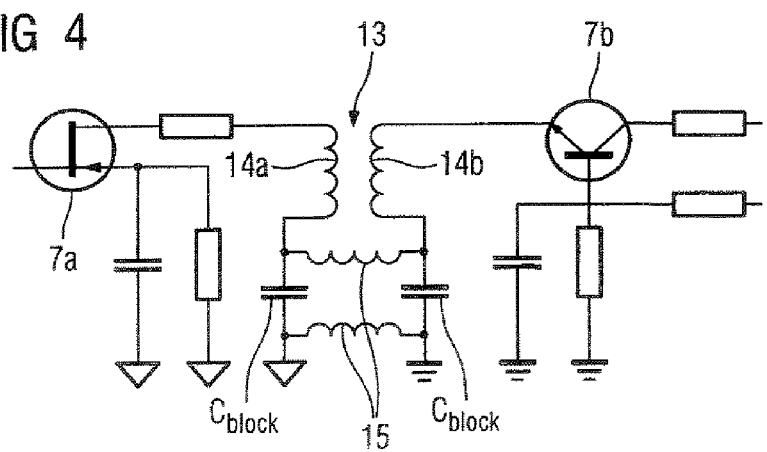
FIG. 4 is a circuit of an alternative embodiment for the antenna amplifier according to FIG. 2, with a sheath wave barrier integrated between two amplifier elements.

FIG. 4 shows a further inventive embodiment of an antenna amplifier 3. FIG. 4 shows the amplifier part composed of both amplifier elements 7a and 7b, via which the amplified signal is supplied to the coaxial signal line (not shown). The amplifier element 7a is, for example, a field-effect transistor; amplifier element 7b is the bipolar transistor already shown in FIG. 2. Here as well an inventive component 13 is used that exclusively lets pass a differential signal but not a common mode signal. It is likewise formed of two separate windings 14a and 14b that are separated from one another and that form a transformer. Here two chokes 15 are also provided for direct voltage supply. Two barrier capacitors $C_{block}$ are also respectively provided that short the radio-frequency signal and ensure that this is exclusively output via the transformer. In this embodiment, a compensation is not necessary because no band filter structure exists. The single compensation point is the setting of the separation of the two windings 14a, 14b, however, this determines only the precise amplification value but not a frequency-specific filter curve; an uncompensated component thus can be used within reasonable tolerances. In this embodiment, the number of turns of the primary winding should be greater than that of the secondary winding, for example in a ratio of 3:1. Because, given the ratio of the number of turns of n:1 with n>1, the amplification remains the same until the coupling factor is reciprocal to the turns ratio, the separation of the windings can be significantly enlarged and at the same time the coupling capacity can be distinctly reduced in this divided cascade amplifier.

Figure 5:
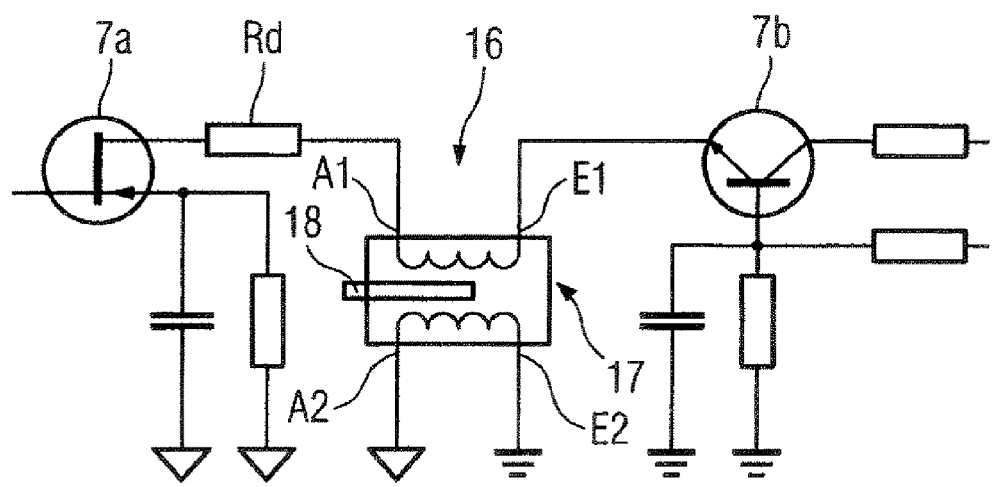
FIG. 5 is a circuit diagram of a further inventive embodiment of an antenna amplifier with a two-wire choke between the two amplifier elements for suppression of sheath waves.

FIG. 5 shows a further alternative embodiment of an antenna amplifier, wherein again only the amplifier with the two amplifier elements 7a and 7b is shown, that is connected with the coaxial signal line (not shown). Instead of two windings arranged on a substrate separated from one another, here only one component 16 passing differential signals is used, in the form of a two-wire (bifilar) wound choke 17. This choke acts as a coiled up line in the useable signal branch. Given use of such a two-wire wound choke 17, its common mode impedance (i.e. the impedance of the coil formed between the connected inputs A1 and A2 and the connected outputs E1 and E2) must be optimally high. In order not to sacrifice the advantages of the cascade circuit, the output of the FET amplifier 7a with the choke should "see" the same low-ohmic termination as without a choke. Without an integrated choke 17, the high-ohmic drain output of the amplifier element (FET transistor) 7a would be connected via the oscillation damping resistance Rd directly with the low-ohmic emitter input of the subsequent amplifier element (bipolar transistor) 7b, which is in fact protected against power loss but leads to known broadband capability and stability of the cascade circuit since the Miller effect is eliminated via the low-ohmic termination of the drain at the amplifier element (FET transistor) 7a. As a second condition, the electrical length of the wound line that forms the choke 17 must therefore be λ/2 long with start A1 and A2 as well as end E1 and E2.

It is now appropriate to attempt to unify both conditions as much as possible. Given a coiled up, two-wire line as the choke 17, if the characteristic line impedance is, if anything, randomly defined by the wire diameter and the wire insulation used, a defined value of, for example, 50 Ω cannot be assumed.

If the electrical length is not set such that it corresponds to λ/2, the uncertainty with regard to the characteristic line impedance, like the extremely different source and termination impedance that the choke sees, plays no role since the λ/2 transformation again reproduces every arbitrary source impedance, independent of the line impedance. The losses over this line are also non-critical; they can, if necessary, be counteracted by appropriate reduction of the resistance Rd.

Figure 6:
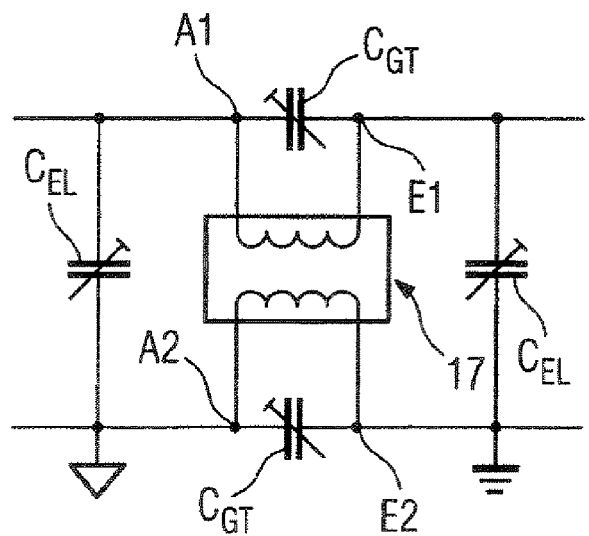
FIG. 6 is a circuit diagram of a comparable sheath wave barrier in the form of a two-wire choke similar to the sheath wave barrier of FIG. 4.

The λ/2 condition can thus be adjusted by suitable selection. In order to also achieve the second condition pertaining to the optimally high common mode impedance, it is necessary to consider the resonance behavior. The optimization of this condition is achieved when the common mode coil (thus the choke) is resonant with the parasitic winding capacity at exactly the operating frequency of the magnetic resonance system, thus the frequency of the useful signal to be captured. Generally it is necessary to adapt the resonance. If, for example, the resonance is too low, the inductance value of the common mode coil can be reduced via a core 18 (for example a copper core that can be moved into the coil cylinder) that can be screwed into the choke 17, without thereby notably changing the electrical length and therewith violating the λ/2 condition. In the case of a resonance that is too high, a ferrite core can be inserted in, but only when the antenna does not operate in a magnetic field. As an alternative to the use of a ferrite core, a resonance that is too high can be adapted using two equally large capacitors respectively associated with the lines. They are respectively inserted between the start A1 and the end E1, or the start A2 and the end E2. This is shown in FIG. 6, where capacitors $C_{GT}$ that lowers the common mode resonance have respectively been inserted between these line points. Both capacitors $C_{GT}$ should be of equal size.

A common mode resonance that is too low alternatively can be increased by an appropriately low winding turn number, whereby the common mode inductance is appropriately increased. If, however, the winding turn number is lowered, the line length (and with it the electrical length) is consequently shortened. In order to compensate for a violation of the λ/2 condition, in this case (see FIG. 5) it is appropriate to compensate both lines of the choke 17 with two further capacitors $C_{EL}$ that should likewise be of equal size. The two capacitors $C_{EL}$ are likewise connected to the starts A1 and A2 or and ends E1 and E2. They form a capacitive shortening.

FIG. 6 shows an embodiment of the choke 17 with associated capacitors that enables both an adaptation of the common mode resonance via the two adjustable capacitors $C_{GT}$ as well as an adaptation of the electrical length via the two adjustable capacitors $C_{EL}$. Due to the shortened wire length, a miniaturization of the choke is also possible, which is in particular very advantageous given low operating frequencies.

It should be noted that the electrical length of the choke also can be selected somewhat smaller than λ/2 in order to increase the power of the antenna amplifier, since then the power matching correspondingly improves, assuming that the cascade amplifier operates sufficiently stably. It should be noted that two different ground symbols are used in figures, namely on a closed triangle and the typical dashed ground symbol, to represent that the respective lines are at different ground areas. The antenna amplifier can also include still further components that here are not shown in detail since they play no role in the inventive functioning or structure of the amplifier.

Although modifications and changes may be suggested by those skilled in the art, it is the intention of the inventors to embody within the patent warranted hereon all changes and modifications as reasonably and properly come within the scope of their contribution to the art.

The invention claimed is:

1. An antenna amplifier comprising:
    amplifier inputs adapted to receive a magnetic resonance signal from a magnetic resonance antenna resonator;
    amplifier outputs adapted to output an amplified magnetic resonance signal to a coaxial line;
    an amplifier circuit between said amplifier inputs and said amplifier outputs, said amplifier circuit comprising a signal path for said magnetic resonance signal and producing said amplified magnetic resonance signal therefrom; and
    a sheath wave barrier integrated into said signal path comprising a component exclusively allowing transfer of a push-pull signal, said component comprising two magnetically coupled windings.

2. An antenna amplifier as claimed in claim 1 wherein said component is comprised of two separated and oppositely magnetically coupled coils forming said magnetically coupled windings.

3. An antenna amplifier as claimed in claim 2 wherein said two coils have a capacitance relative to each other of less than or equal to 1 pF.

4. An antenna amplifier as claimed in claim 2 wherein said two coils comprise a primary coil and a secondary coil, said primary coil having a number of coil windings that is different from a number of coil windings of said secondary coil.

5. An antenna amplifier as claimed in claim 4 wherein said number of windings of said secondary coil is less than the number of windings of said primary coil.

6. An antenna amplifier as claimed in claim 2 wherein said two coils each have a same number of coil windings.

7. An antenna amplifier as claimed in claim 6 wherein each of said two coils comprises one coil winding.

8. An antenna amplifier as claimed in claim 2 comprising two capacitors respectively associated with said two coils, each of said coils and the associated capacitor forming an oscillator circuit, and wherein said amplifier circuit comprises an amplifier component and two radio-frequency chokes connected to said amplifier component for supplying said amplifier component with current, said two radio-frequency chokes being respectively connected to said oscillator circuits and having an inductance causing the respective oscillator circuits to form a resonant band filter at an operating frequency used to obtain said magnetic resonance signal.

9. An antenna amplifier as claimed in claim 1 wherein said component comprises a wound, two-wire choke.

10. An antenna amplifier as claimed in claim 9 wherein said choke has an electrical length corresponding to $\lambda/2$ or a whole-number multiple thereof.

11. An antenna amplifier as claimed in claim 9 wherein said choke is resonant at an operating frequency used to obtain said magnetic resonant signal.

12. An antenna amplifier as claimed in claim 11 wherein said choke comprises a core and a hollow winding in which said core is moveable to adjust an inductance of said choke, thereby also adjusting the resonance of said choke.

13. An antenna amplifier as claimed in claim 11 wherein said choke is connected across parallel electrical lines, said choke having a pair of electrical connections to each of said electrical lines, and comprising capacitors respectively connected between said pairs of electrical connections for adjusting said resonance of said choke.

14. An antenna apparatus as claimed in claim 13 wherein said choke and said capacitors respectively connected between said pairs of connections exhibit a shortened electrical length, and comprising two capacitors respectively connected across said parallel lines, on opposite sides of said choke, to compensate for said shortened electrical length.

15. An antenna amplifier as claimed in claim 1 wherein said amplifier circuit comprises a first amplifier component and a second amplifier component, and wherein said component for exclusively transferring a push-pull signal is connected between said first and second amplifier components.

16. An antenna amplifier as claimed in claim 1 wherein said amplifier circuit comprises a first amplifier element and a second amplifier element connected at an output side of said amplifier circuit, and wherein said component for exclusively transferring said push-pull signal is connected downstream from said second amplifier component.

17. A magnetic resonance antenna comprising:
    an antenna resonator adapted to receive a magnetic resonance signal; and
    an antenna amplifier comprising an amplifier circuit having amplifier inputs connected to said resonator for receiving said magnetic resonant signal therefrom, amplifier outputs adapted to output an amplified magnetic resonance signal to a coaxial line; said amplifier circuit comprising a signal path for said magnetic resonance signal, said component comprising two magnetically coupled windings, and a sheath wave barrier integrated into said signal path comprising a component that exclusively transfers a push-pull signal, said component comprising two magnetically coupled windings.

* * * * *